(12) United States Patent
Chen et al.

(10) Patent No.: US 12,349,585 B2
(45) Date of Patent: Jul. 1, 2025

(54) PB-FREE PEROVSKITE MATERIALS FOR SHORT WAVE IR DEVICES

(71) Applicants: HONDA MOTOR CO., LTD., Tokyo (JP); UTAH STATE UNIVERSITY, Logan, UT (US)

(72) Inventors: Gugang Chen, Powell, OH (US); Yi Rao, Logan, UT (US); Xia Li, Logan, UT (US)

(73) Assignees: HONDA MOTOR CO., LTD., Tokyo (JP); UTAH STATE UNIVERSITY, Logan, UT (US)

( * ) Notice: Subject to any disclaimer, the term of this patent is extended or adjusted under 35 U.S.C. 154(b) by 921 days.

(21) Appl. No.: 17/089,096

(22) Filed: Nov. 4, 2020

(65) Prior Publication Data

US 2021/0175451 A1 Jun. 10, 2021

Related U.S. Application Data

(60) Provisional application No. 62/944,899, filed on Dec. 6, 2019.

(51) Int. Cl.
*H10K 71/40* (2023.01)
*C01G 29/00* (2006.01)
*C01G 30/00* (2006.01)
*H10K 71/15* (2023.01)

(52) U.S. Cl.
CPC ......... *H10K 71/441* (2023.02); *C01G 29/006* (2013.01); *C01G 30/006* (2013.01); *H10K 71/15* (2023.02); *C01P 2002/34* (2013.01)

(58) Field of Classification Search
USPC ........................................................ 423/463
See application file for complete search history.

(56) References Cited

U.S. PATENT DOCUMENTS

2017/0194101 A1  7/2017  Karunadasa et al.
2018/0290897 A1  10/2018  Snaith et al.

FOREIGN PATENT DOCUMENTS

CN  108028320 A     5/2018
WO  2018/085211 A1  5/2018

OTHER PUBLICATIONS

Lei, L. Z., et al. "High-efficiency and air-stable photodetectors based on lead-free double perovskite Cs2AgBiBr6 thin films." J Mater. Chem. C, 2018, 6, 7982. (Year: 2018).*
Wang, Q., et al. "Stabilizing the a-phase of CsPbl3 perovskite by sulfobetaine zwitterions in one-step spin-coating films." Joule 1, 371-382 (2017). (Year: 2017).*
Wu, C., et al. The dawn of lead-free perovskite solar cell: Highly stable double perovskite Cs2AgBiBr6 film. Adv. Sci. 2018, 5, 1700759; published online on Dec. 18, 2017.*

(Continued)

*Primary Examiner* — Anthony J Zimmer
*Assistant Examiner* — Zachary John Baum
(74) *Attorney, Agent, or Firm* — ArentFox Schiff LLP; Mark Duell

(57) ABSTRACT

The present disclosure is directed to methods of making Pb-free perovskites for short-wave IR (SWIR) devices and to various Pb-free perovskite materials disclosed herein. The perovskites disclosed herein have improved chemical stability and long-term stability, while the production methods disclosed herein have improved safety and lower cost.

24 Claims, 5 Drawing Sheets

(56) References Cited

OTHER PUBLICATIONS

Igbari, F., et al. Composition stoichiometry of Cs2AgBiBr6 films for highly efficient lead-free perovskite solar cells. Nano Lett. 2019, 19, 2066-2073. (Year: 2019).*

Communication dated Sep. 5, 2022, from the State Intellectual Property Office of People's Republic of China in Application No. 202011404232.5.

George Volonakis et al., "Lead-Free Halide Double Perovskites via Heterovalent Substitution of Noble Metals", American Chemical Society, J. Phys. Chem. Lett. 2016, 7, pp. 1254-1259, (2016). http://dx.doi.org/10.1021/acs.jpclett.6b00376.

Enrico Greul et al., Highly stable, phase pure Cs2AgBiBr6 double perovskite thin films for optoelectronic applications, Journal of Materials Chemistry A, (2017), 5, 19972, (pp. 19972-19981), DOI: 10.1039/c7ta06816f, The Royal Society of Chemistry 2017.

Ling-Zhi Lei et al., High-efficiency and air-stable photodetectors based on lead-free double perovskite Cs2AgBiBr6 thin films, Journal of Materials Chemistry C, (2018), 6, pp. 7982-7988, The Royal Society of Chemistry 2018, DOI: 10.1039/c8tc02305k.

Martin H. Ettenberg et al., Light Source Selection: one key to a successful short-wave infrared imaging application, Short-wave infrared enhances machine vision, Vision Systems Design, https://www.vision-systems.com/cameras-accessories/non-visible/article/16737608/shortwave-infrared-enhances-machine-vision, (Nov. 14, 2017), (25 Pages Total).

Princeton Infrared Technologies, Inc., Applications for SWIR Imagers and SWIR Cameras, An Expanding List of Practical Applications, (7 Pages Total), https://www.princetonirtech.com/applications, (as retrivied on Oct. 15, 2020).

R. Hamilton Shepard III et al., Material selection for color correction in the short-wave infrared, Proceedings of SPIE vol. 7060, Current Developments in Lens Design and Optical Engineering IX, 70600E (Aug. 29, 2008); doi: 10.1117/12.794826, (11 Pages Total).

Ralf Jedamzik et al., From VIS to SWIR: A challenge for optical glass and IR materials, Proceedings of SPIE, 10528, Optical Components and Materials XV, 105280P (Feb. 22, 2018); doi: 10.1117/12.2297161, (15 Pages Total).

Weicheng Pan et al., Cs2AgBiBr6 single-crystal X-ray detectors with a low detection limit, Nature Photonics, 2017 Macmillan Publishers Limited, part of Springer Nature, (2017), (8 Pages Total), DOI: 10.1038/s41566-017-0012-4.

Adam H. Slavney et al., "A Bismuth-Halide Double Perovskite with Long Carrier Recombination Lifetime for Photovoltaic Applications", Journal of the American Chemical Society, (2016), vol. 138, (15 Pages Total) ,https://doi.org/10.1021/jacs.5b13294.

Communication dated Nov. 24, 2021, from the Japanese Patent Office in related application No. 2020-200940.

Filip et al., "Band Gaps of the lead-free halide double perovskites Cs2BiAgCl6 and Cs2BiAgBr6 from theory and experiment," The Journal of Physical Chemistry Letters, 2016, vol. 7, No. 13, 39 Pages Total.

Li et al., "Satellite Remote Sensing Technology (vol. 1)," Beijing Institute of Technology Press, Mar. 2018, 1st Edition, 45 Pages Total.

Office Action in CN202011404232.5, mailed Feb. 24, 2023, 21 pages total.

Weng et al., "Lead-Free Cs2BiAgBr6 Double Perovskite-Based Humidity Sensor with Superfast Recovery Time," Advanced Functional Materials, Jun. 2019, vol. 29, Issue 24, 10 Pages Total.

* cited by examiner

PB-FREE PEROVSKITE MATERIALS FOR SHORT WAVE IR DEVICES

CROSS-REFERENCE TO RELATED APPLICATION

This application claims priority to U.S. Provisional Application No. 62/944,899, filed Dec. 6, 2019, the disclosure of which is expressly incorporated herein by reference in its entirety.

JOINT RESEARCH AGREEMENT

The presently claimed invention was made by or on behalf of the below listed parties to a joint research agreement. The joint research agreement was in effect on or before the date the claimed invention was made, and the claimed invention was made as a result of activities undertaken within the scope of the joint research agreement. The parties to the joint research agreement are 1) Honda Research Institute USA, Inc.; and 2) Utah State University.

BACKGROUND

Short-wave infrared (SWIR) light detection has gained great interest due to the many applications of SWIR from astronomy to detection of product defects. For imaging applications, various wavelengths of SWIR can extend from 550 nm up to 3 microns. Compared to visible light detectors, SWIR detectors can have a number of advantages in a variety of applications. When imaging in SWIR, water vapor, fog, and certain materials such as silicon can be transparent. Unlike Mid-Wave Infrared (MWIR) and Long-Wave Infrared (LWIR) light, which is emitted from an object, SWIR can be similar to visible light in that photons are reflected or absorbed by an object, providing a strong contrast needed for high resolution imaging. Many existing SWIR detectors are expensive, small in size, and have poor chemical stability. For higher sensitivities, some SWIR detectors require a low operating temperature. As a result, some of these types of detectors can be restricted to high-cost applications. Existing short-wave IR sensors are primarily based on materials such as InGaAs, HgCdTe, InSb, and Pb-based perovskites. Many of these materials are expensive and are toxic. These limitations also originate from the complex fabrication of InGaAs (indium gallium arsenides) and various other materials. Thus, there is a need for lower cost and environmentally-friendly Pb-free short-wave IR materials having unique light absorbance from the visible to SWIR.

SUMMARY

The present disclosure is directed to Pb-free perovskite materials for short-wave IR devices and methods of making perovskite materials. In some embodiments, various double metals can be utilized to replace Pb for stable perovskite structures which can have a broad absorbance from 1000 nm to 2800 nm. In some embodiments, the materials disclosed herein have a broader absorbance from 1000 nm to 2800 nm than traditional SWIR materials such as InGaAs, HgCdTe, and InSb. Methods of making stable and Pb-free perovskite materials are disclosed herein wherein a variety of metals can be utilized. In some embodiments, the resulting Pb-free perovskite materials can comprise various elements and a long-term stability of the perovskite crystal structure. Previous perovskites have poor chemical stability, poor long-term stability, and the fabrication procedures for traditional SWIR materials are complicated.

DETAILED DESCRIPTION

Figure 1:
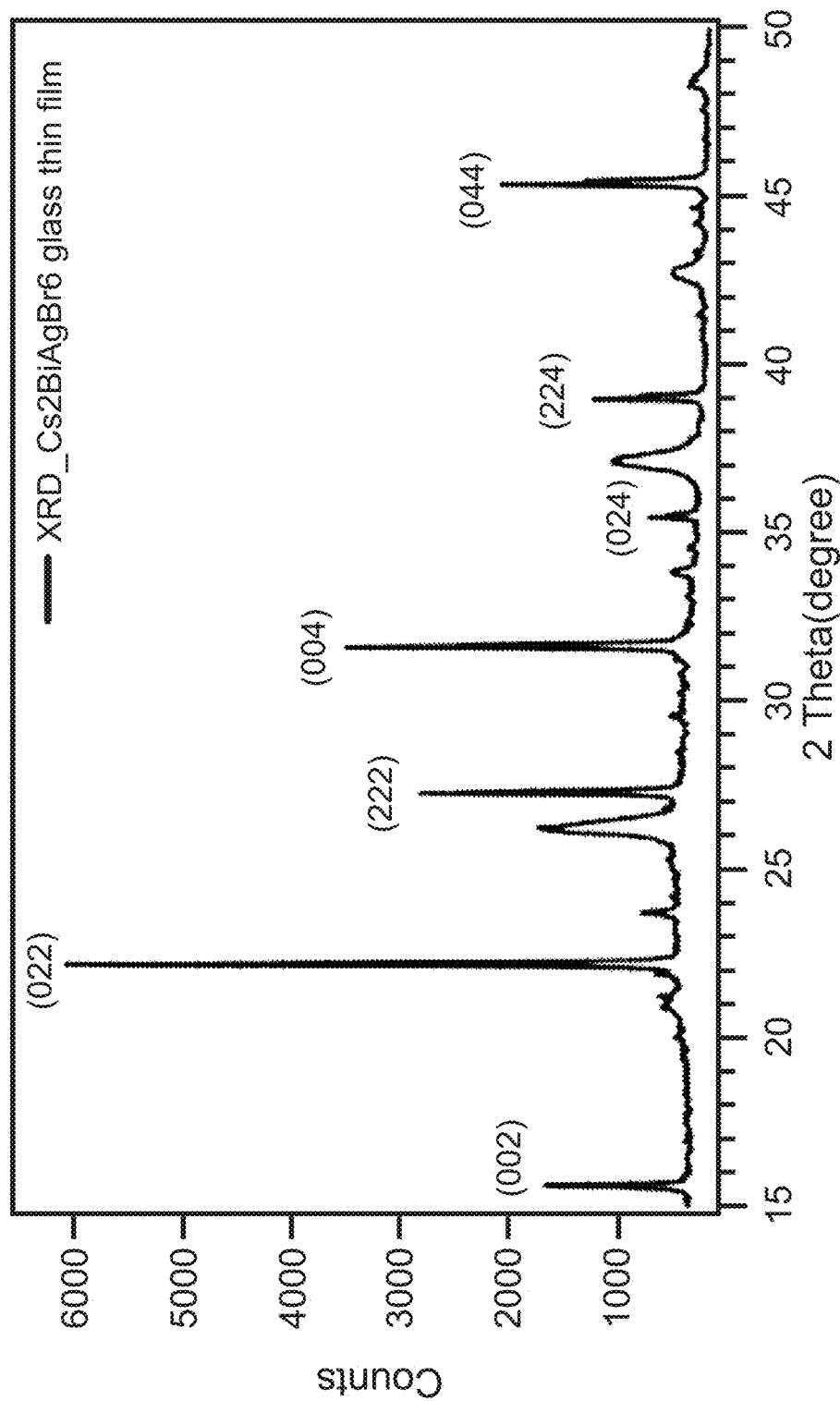
FIG. 1 shows an XRD pattern of a $Cs_2BiAgBr_6$ perovskite thin film on a glass substrate.

The present disclosure is directed to methods for preparing Pb-free perovskites for short-wave IR devices. In some embodiments, the methods can comprise preparation of a metal precursor solution. According to some aspects, the metal precursor solution contains a mixture of one or more trivalent metal salts and one or more monovalent metal salts. For example, $BiBr_3$ can be utilized as a trivalent metal salt, and Bi can be replaced by other trivalent metals. Non-limiting examples of monovalent salts are AgBr and CsBr, and the Ag or the Cs can be replaced by other inorganic and organic monovalent metal salts. The example anion, Br—, can be replaced by other monovalent nonmetals, and non-limiting examples of anions are Cl— and I—.

According to some aspects, the metal precursor solution can be prepared by dissolving a trivalent metal salt, a first monovalent metal salt, and a second monovalent metal salt in a molar ratio of 1:1:2, respectively, in a suitable solvent. A suitable solvent can be an organic solvent having a capability to dissolve the salts, and some non-limiting examples of solvents are DMSO (dimethyl sulfoxide) and DMF (dimethylformamide). According to some aspects, one or more stabilizers can optionally be dispersed or dissolved in the metal precursor solution in addition to the dissolved salts. In some embodiments, the solvent utilized can stabilize a perovskite structure.

The metal precursor solution, in some embodiments, can be heated after preparation to a temperature less than the boiling point of the organic solvent, optionally to a temperature from about 25-90° C., optionally to a temperature from about 40-90° C., or optionally to a temperature from about 60-80° C. The metal precursor solution can then be dispersed onto a suitable heated substrate. The substrate can be a flexible or inflexible material, for example, glass can be utilized, or a flexible polymer can be utilized. The substrate can be heated to a temperature from about 40-200° C., optionally to a temperature from about 50-190° C., optionally to a temperature from about 80-190° C., and optionally to a temperature from about 100-190° C. In some embodiments, a substrate utilized can stabilize a perovskite structure subsequently formed on the substrate.

The metal precursor solution can be dispersed onto a substrate by any means known in the art to form a thin film of metal precursor solution on the substrate. One non-limiting example of dispersing is spin-coating, which comprises spinning the substrate at a suitable speed and dispersing the metal precursor solution onto the spinning substrate. For example, the metal precursor solution can form a thin film on a spinning substrate. The substrate can be spinning at a suitable speed to disperse the metal precursor solution (and form a thin film of metal precursor solution) but not at such an excessive speed to dislodge the metal precursor solution from the substrate. Non-limiting examples of spinning speeds are from about 500-3000 rpm, optionally from about 1000-2000 rpm, and optionally about 2000 rpm. It should be understood that the spinning speed can vary depending on, for example, the viscosity of the solvent(s) utilized in the metal precursor solution or the concentration of the metal precursor solution.

According to some aspects, after forming a thin film on a substrate, the dispersed metal precursor solution can be annealed upon the substrate. In some embodiments, a thin film of metal precursor solution is annealed on the substrate. According to some aspects, depending on the annealing conditions, and for example, the chemical composition of the metal precursor solution, the wavelength of maximum SWIR absorbance of the resulting perovskite material can change. Annealing can optionally be performed under vacuum conditions. Annealing temperature can be from about 40-300° C., optionally from about 100-300° C., optionally from about 200-300° C., and optionally from about 250-300° C. Annealing can be done for a suitable time and at a suitable temperature, to form a perovskite material on the substrate. Non-limiting examples of annealing times are from about 1-60 minutes, from about 5-45 minutes, from about 10-30 minutes, or from about 15-30 minutes. In some embodiments, higher annealing temperatures, different annealing conditions, or longer annealing times can form perovskite material with a higher wavelength of maximum SWIR absorbance.

In a non-limiting example, $BiBr_3$, $AgBr$, and $CsBr$ can be dissolved in anhydrous DMSO (dimethyl sulfoxide) in a molar ratio of 1:1:2, respectively to form a metal precursor solution. The metal precursor solution can be heated to about 70-90° C. and spin-coated for about 20 seconds, to form a thin film, on a glass substrate, which is pre-heated at 170-190° C. and spinning at about 2000 rpm. The thin film can then be annealed at 250-300° C. for 30 minutes to obtain a uniform orange thin film. Example 1, described below, provides an example of a specific embodiment.

FIG. 1 shows the X-ray diffraction pattern of a perovskite $Cs_2BiAgBr_6$ thin film prepared according to Example 1. The XRD spectrum indicates the formation of highly pure $Cs_2BiAgBr_6$ perovskite material. The main XRD peaks located at 15.62°, 22.18°, 27.26°, 31.59°, 35.45°, 39.0°, and 45.33° can be indexed to the (002), (022), (222), (004), (024), (224) and (044) planes of $Cs_2BiAgBr_6$, respectively. Some small peaks were also detected that were from impurities of the glass substrate. The lattice indexes are in agreement with the standard XRD pattern of $Cs_2BiAgBr_6$ perovskite of corner-sharing octahedral 3D structure.

Figure 2A:
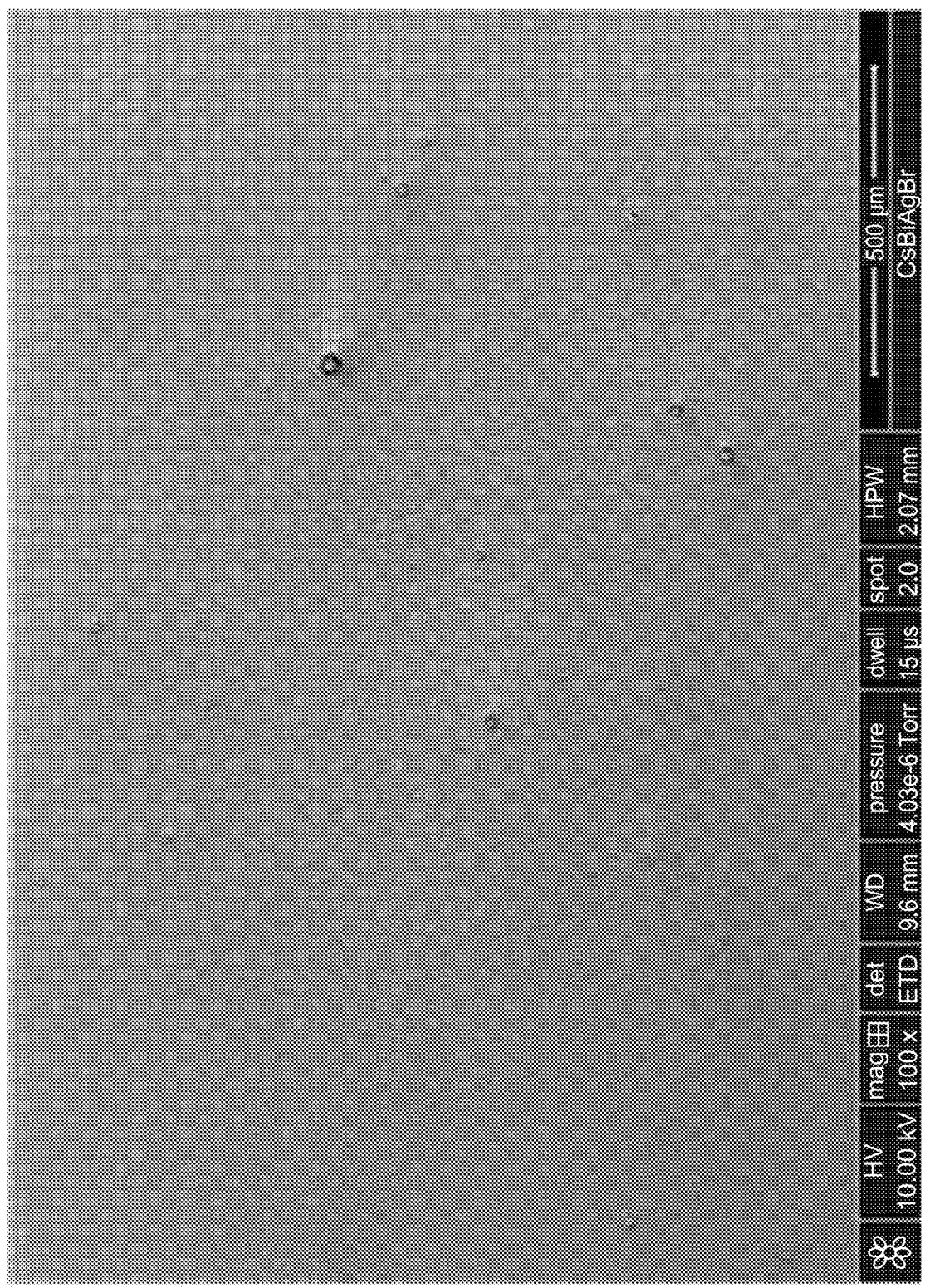
FIG. 2A shows a SEM (scanning electron microscope) image of perovskite $Cs_2BiAgBr_6$ thin film on a glass substrate. The SEM image was acquired utilizing a field emission SEM (FEI Quanta 450 FEG).
Figure 2B:
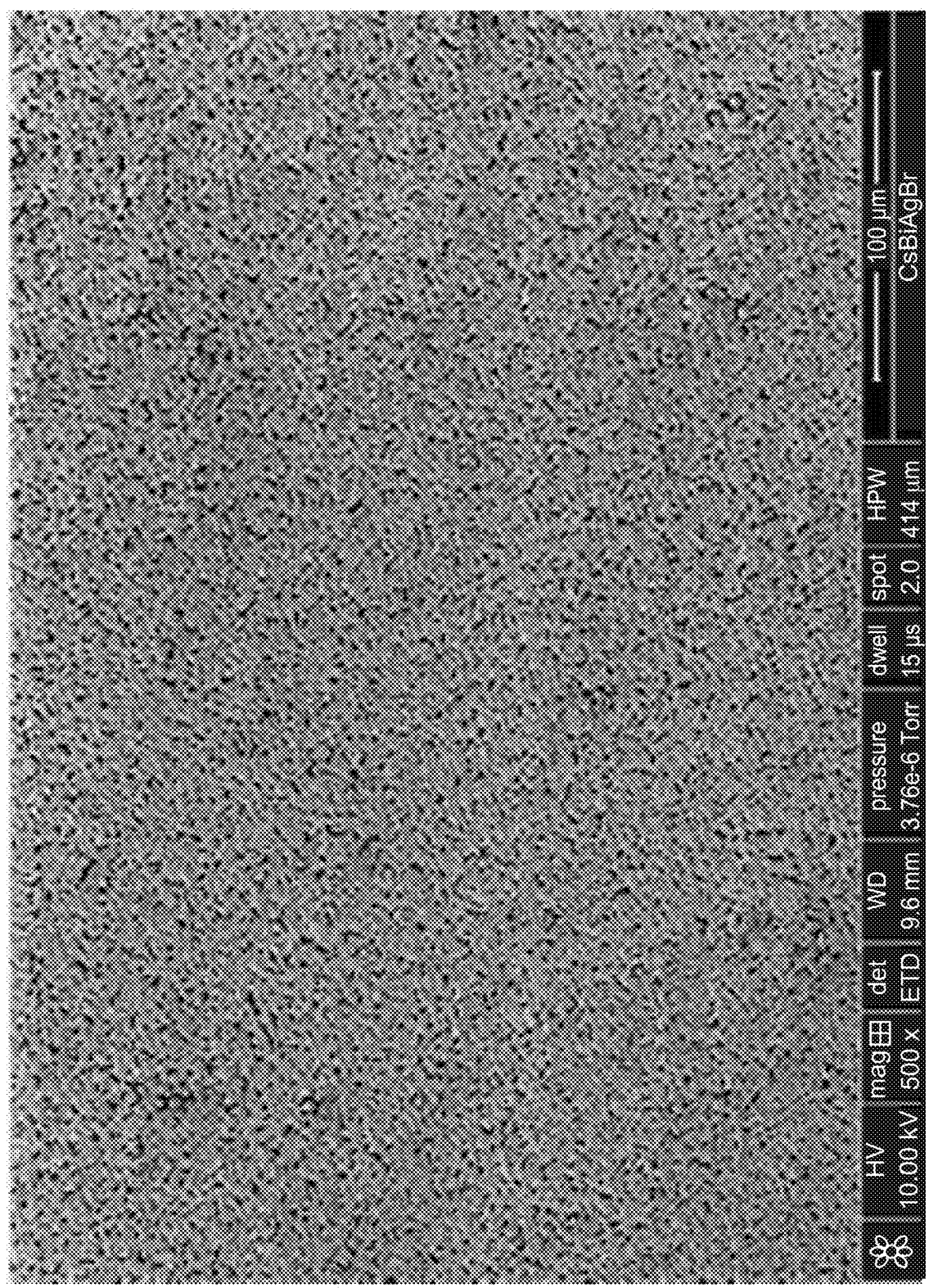
FIG. 2B shows a magnified SEM (scanning electron microscope) image of perovskite $Cs_2BiAgBr_6$ thin film on glass, acquired utilizing a field emission SEM (FEI Quanta 450 FEG).
Figure 3:
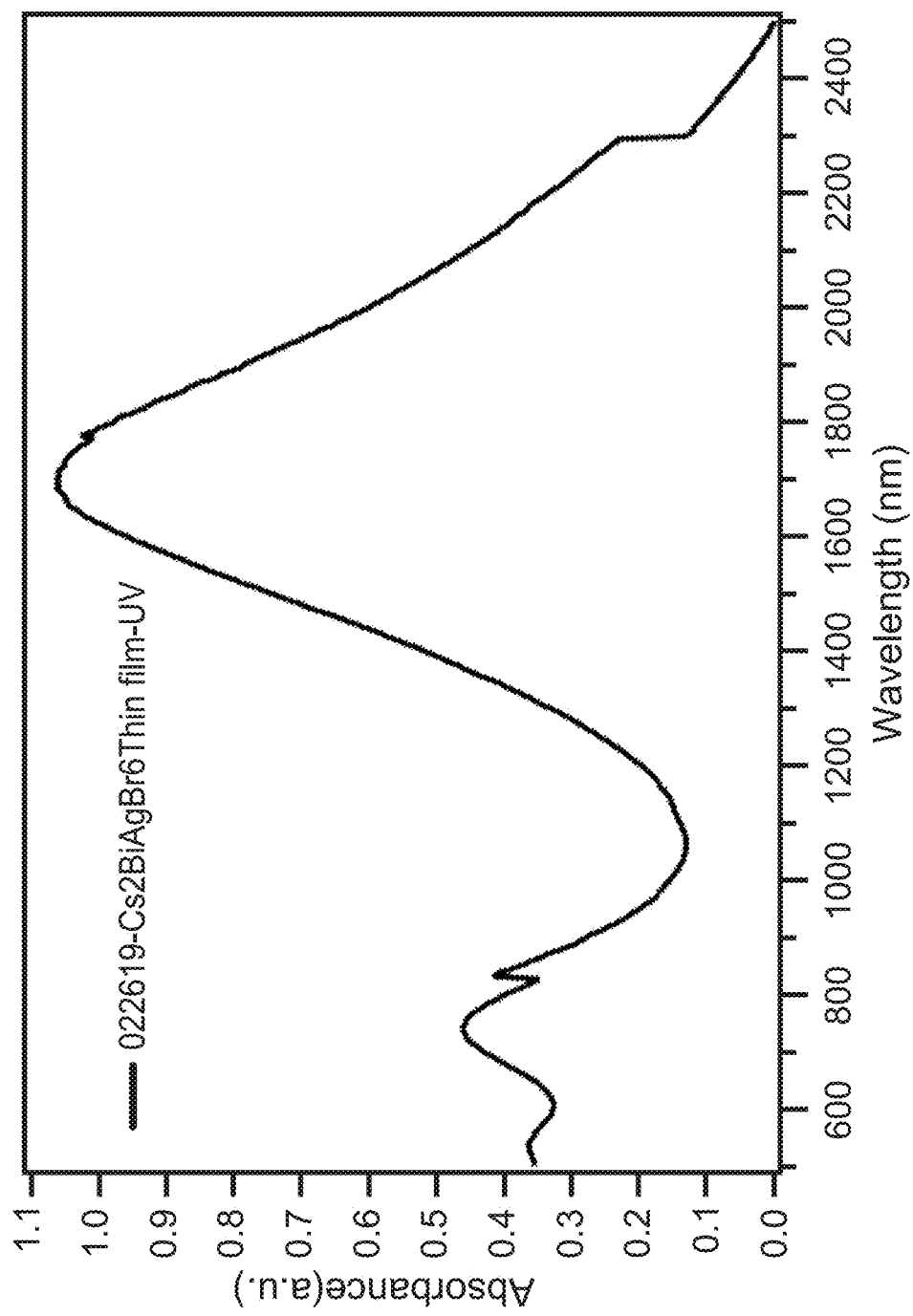
FIG. 3 shows the UV-Vis-NIR absorbance spectrum of a $Cs_2BiAgBr_6$ perovskite thin film.
Figure 4:
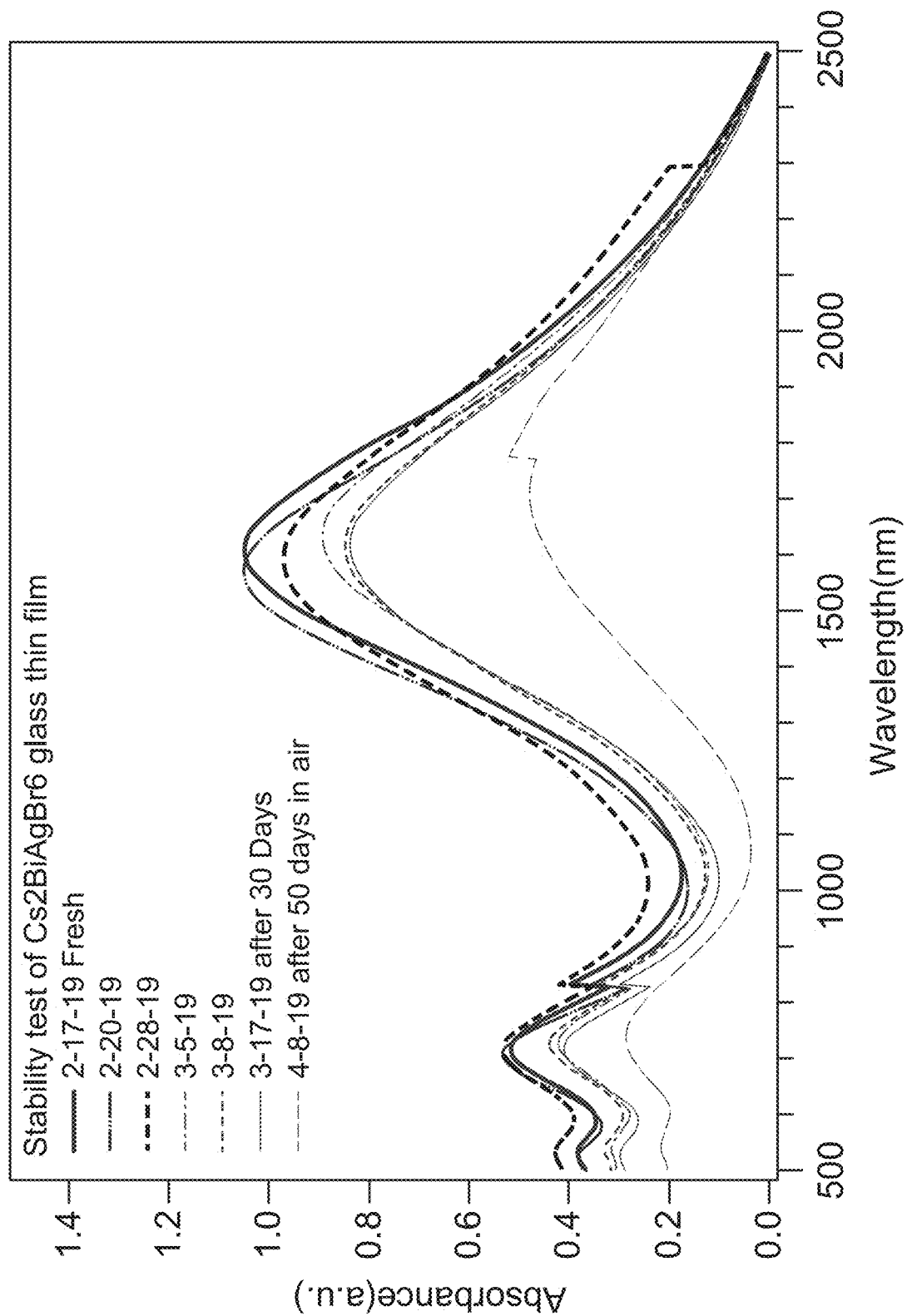
FIG. 4 shows the UV-Vis-NIR absorbance spectrum of a $Cs_2BiAgBr_6$ perovskite thin film on a glass substrate after zero days ("Fresh", top spectrum), 3 days, 11 days, and other time points after 30 days and after 50 days in air.

FIG. 2A and FIG. 2B shows the SEM (scanning electron microscope) images of a $Cs_2BiAgBr_6$ thin film prepared by an embodiment described in Example 1. FIG. 3 shows a UV-Vis-NIR absorbance spectrum of the $Cs_2BiAgBr_6$ perovskite thin film. The significant peak at 1710 nm shows that the material has strong SWIR absorbance with a broad range from 1100 nm to 2500 nm. FIG. 4 shows the stability of the $Cs_2BiAgBr_6$ perovskite thin film. There is no obvious change of SWIR absorbance of $Cs_2BiAgBr_6$ perovskite thin film after stored in ambient condition for 50 days. The top (black) curve represents the spectrum of the fresh sample, followed by measurements of UV-Vis-NIR after stored in air for different periods. As shown in the graph in FIG. 4, SWIR absorbance range and the highest peaks are consistent with time after storage in ambient conditions for up to 50 days, suggesting that the material has superior chemical stability.

In some embodiments, an optional stabilizer can be added, dispersed, or dissolved in the metal precursor solution. A non-limiting example of a stabilizer is 1-(3-sulfopropyl) pyridinium hydroxide inner salt.

The present disclosure is also directed to the Pb-free perovskites made by the methods disclosed herein, devices comprising the Pb-free perovskites, and methods of use. The methods of making Pb-free perovskites disclosed herein are not limited by the exemplary embodiments disclosed herein. The methods and examples disclosed herein enable production of Pb-free perovskites having stable crystal form (polymorph stability) and having stable chemical composition. The Pb-free perovskites enabled herein can be utilized for solar cells, SWIR light detectors, various light emitting devices, cameras, calibration devices, and for other devices and applications.

It should be understood that the perovskite crystal structure disclosed herein can refer to a double $A_2B'B''X_6$ or $A^{+2}B'^{3+}B''^{+}X^-_6$ perovskite wherein A is an organic or inorganic cation, $B'^{3+}$ is a trivalent organic or inorganic cation, $B''^+$ is a monovalent cation, and $X^-$ is a nonmetal or halogen anion. In some embodiments, the perovskite structure disclosed herein can also take the form of or replace an $A+B^{2+}X_3$ perovskite wherein $A^+$ represents a cation, $B^{2+}$ represents a divalent cation (e.g. lead), and X can represent a nonmetal or halogen anion. According to some aspects, a Pb-free perovskite material having the general formula $A^{3+}B^+C^+XYZ_3$ is disclosed wherein: $A^{3-}Z_3$ is a first compound comprising: $A^{3+}$, a first trivalent metal cation, and $Z_3$, three first monovalent anions; $B^+Y$ is a second compound comprising: $B^+$, a second monovalent alkali earth metal, and Y, a second monovalent anion; and $C^+X$ is a third compound comprising: $C^+$, a third monovalent alkali earth metal, and X, a third monovalent anion; and wherein the molar ratio of the first compound:second compound:third compound is about 1:1:2.

According to some aspects, various solvents, stabilizers, and/or substrates can stabilize the perovskite structures disclosed herein. The data shown in FIG. 4 demonstrates formation of a stable perovskite structure capable of maintaining absorbance of SWIR light at ambient conditions over time. Depending on the starting materials utilized, the resulting perovskite structure can be, for example, an undistorted cubic structure, an orthorhombic structure, a tetragonal structure, or a trigonal structure.

To form the various crystal structures, according to some aspects, the Pb-free perovskite materials disclosed herein can be wherein the trivalent metal salt contains bismuth trivalent cation, antimony trivalent cation, indium trivalent cation, or combinations thereof. A first monovalent cation can comprise silver monovalent cation, copper monovalent cation, gold monovalent cation, sodium monovalent cation, or combinations thereof. A second monovalent cation can comprise cesium monovalent cation, an organic metal monovalent cation, an inorganic metal monovalent cation, or combinations thereof. In some embodiments, the three monovalent anions, the first monovalent anion, and the second monovalent anion can comprise Br—, Cl—, I—, or combinations thereof. Thermogravimetric analysis (TGA) showed the material is thermally stable up to 430° C. (JACS. 2016, 138, 2138-2141).

According to some aspects, the methods and materials disclosed herein can provide hybrid semiconductor materials comprising an intermediate-band (IB) strategy in which a wide optical gap is divided into a high-energy visible component and a low-energy IR (short-wave) component as demonstrated by FIGS. 3-4.

The methods disclosed herein can enable thin film, large-area growth of perovskite materials by both solution-processing or dispersion of the precursor solution on a large area of substrate and physical vapor transport (e.g., annealing, temperature of the substrate) for the control of short-wave IR absorption. In some embodiments, the fabrication methods disclosed herein can provide large-area SWIR sensors on flexible substrates.

As used herein, the term "about" is defined to being close to as understood by one of ordinary skill in the art. In one non-limiting embodiment, the term "about" is defined to be within 10%, preferably within 5%, more preferably within 1%, and most preferably within 0.5%.

In some embodiments, the methods disclosed herein can be carried out, either partially or fully, under an inert atmosphere. An "inert atmosphere" refers to a gaseous mixture that contains little or no oxygen and comprises inert or non-reactive gases or gases that have a high threshold before they react. An inert atmosphere may be, but is not limited to, molecular nitrogen or an inert gas, such as argon, or mixtures thereof. Examples of inert gases useful according to the present disclosure include, but are not limited to, gases comprising helium (He), radon (Rd), neon (Ne), argon (Ar), xenon (Xe), nitrogen (N), and combinations thereof.

"Alkali metal salts" are metal salts in which the metal ions are alkali metal ions, or metals in Group I of the periodic table of the elements, such as lithium, sodium, potassium, rubidium, cesium, or francium.

"Alkaline earth metal salts" are metal salts in which the metal ions are alkaline earth metal ions, or metals in Group II of the periodic table of the elements, such as beryllium, magnesium, calcium, strontium, barium, or radium.

"Transition metal salts" are metal salts in which the metal ions are transition metal ions, or metals in the d-block of the periodic table of the elements, including the lanthanide and actinide series. Transition metal salts include, but are not limited to, salts of scandium, titanium, vanadium, chromium, manganese, iron, cobalt, nickel, copper, zinc, yttrium, zirconium, niobium, molybdenum, technetium, ruthenium, rhodium, palladium, silver, cadmium, lanthanum, cerium, praseodymium, neodymium, promethium, samarium, europium, gadolinium, terbium, dysprosium, holmium, erbium, thulium, ytterbium, lutetium, hafnium, tantalum, tungsten, rhenium, osmium, iridium, platinum, gold, mercury, actinium, thorium, protactinium, uranium, neptunium, plutonium, americium, curium, berkelium, californium, einsteinium, fermium, mendelevium, nobelium, and lawrencium.

"Post-transition metal salts" are metal salts in which the metal ions are post-transition metal ions, such as gallium, indium, tin, thallium, lead, bismuth, or polonium.

While the aspects described herein have been described in conjunction with the example aspects outlined above, various alternatives, modifications, variations, improvements, and/or substantial equivalents, whether known or that are or may be presently unforeseen, may become apparent to those having at least ordinary skill in the art. Accordingly, the example aspects, as set forth above, are intended to be illustrative, not limiting. Various changes may be made without departing from the spirit and scope of the disclosure. Therefore, the disclosure is intended to embrace all known or later-developed alternatives, modifications, variations, improvements, and/or substantial equivalents.

Thus, the claims are not intended to be limited to the aspects shown herein but are to be accorded the full scope consistent with the language of the claims, wherein reference to an element in the singular is not intended to mean "one and only one" unless specifically so stated, but rather "one or more." All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

Further, the word "example" is used herein to mean "serving as an example, instance, or illustration." Any aspect described herein as "example" is not necessarily to be construed as preferred or advantageous over other aspects. Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. Nothing disclosed herein is intended to be dedicated to the public regardless of whether such disclosure is explicitly recited in the claims.

The examples are put forth so as to provide those of ordinary skill in the art with a complete disclosure and description of how to make and use the present invention, and are not intended to limit the scope of what the inventors regard as their invention nor are they intended to represent that the experiments below are all or the only experiments performed. Efforts have been made to ensure accuracy with respect to numbers used (e.g. amounts, dimensions, etc.) but some experimental errors and deviations should be accounted for.

This detailed description uses examples to present the disclosure, including the preferred aspects and variations, and to enable any person skilled in the art to practice the disclosed aspects, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims. Aspects from the various embodiments described, as well as other known equivalents for each such aspect, can be mixed and matched by one of ordinary skill in the art to construct additional embodiments and techniques in accordance with principles of this application.

While the aspects described herein have been described in conjunction with the example aspects outlined above, various alternatives, modifications, variations, improvements, and/or substantial equivalents, whether known or that are or may be presently unforeseen, may become apparent to those having at least ordinary skill in the art. Accordingly, the example aspects, as set forth above, are intended to be illustrative, not limiting. Various changes may be made without departing from the spirit and scope of the disclosure. Therefore, the disclosure is intended to embrace all known or later-developed alternatives, modifications, variations, improvements, and/or substantial equivalents.

Reference to an element in the singular is not intended to mean "one and only one" unless specifically so stated, but rather "one or more." All structural and functional equivalents to the elements of the various aspects described throughout this disclosure that are known or later come to be known to those of ordinary skill in the art are expressly incorporated herein by reference. Moreover, nothing disclosed herein is intended to be dedicated to the public.

Further, the word "example" is used herein to mean "serving as an example, instance, or illustration." Any aspect described herein as "example" is not necessarily to be construed as preferred or advantageous over other aspects. Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C.

As used herein, the terms "highly pure" and "high purity" are defined as about 98-100%, 99-100%, 99.9-100%, 99.99-100%, or 99.999%-100% pure.

Herein, the recitation of numerical ranges by endpoints (e.g. 50 mg to 600 mg, between about 100 and 500° C., between about 1 minute and 60 minutes) include all numbers subsumed within that range, for example, between about 20 minutes and 40 minutes includes 21, 22, 23, and 24 minutes as endpoints within the specified range. Thus, for example, ranges 22-36, 25-32, 23-29, etc. are also ranges with endpoints subsumed within the range 20-40 depending on the starting materials used, specific applications, specific embodiments, or limitations of the claims if needed. The Examples and methods disclosed herein demonstrate the recited ranges subsume every point within the ranges because different results or products can be derived after changing one or more reaction parameters. Further, the methods and Examples disclosed herein describe various aspects of the disclosed ranges and the effects if the ranges are changed individually or in combination with other recited ranges.

EXAMPLES

Cesium bromide (99%), silver bromide (99.5%), and anhydrous dimethyl sulfoxide were purchased from Alfa Aesar. Bismuth (III) bromide was purchased from Sigma-Aldrich. All chemicals were used as received without further purification.

Example 1: $Cs_2BiAgBr_6$ Thin Film Formation

A precursor solution was prepared by dissolving 0.5 mmol of $BiBr_3$, 0.5 mmol of AgBr and 1.0 mmol of CsBr in 1 ml of anhydrous DMSO (dimethyl sulfoxide) in a vial covered with aluminum foil. The precursor solution was then stirred at room temperature allowing the materials to be fully dissolved before use. For thin film formation, the precursor solution was heated to 70-90° C. and spin-coated onto a glass substrate pre-heated at 170-190° C. at 2000 rpm for 20 seconds, followed by annealing at 250-300° C. for 30 min to obtain a uniform orange thin film. In addition, Cs can be replaced by any other inorganic or organic monovalent metal, Bi can be replaced by any other trivalent metal, Ag can be replaced by any other inorganic and organic monovalent metal, Br can be replaced by other monovalent nonmetal such as Cl, I, etc.

The UV and short-wave IR absorbance spectra were collected using a spectrophotometer (Varian Cary 5000 UV-Vis-NIR spectrometer) in the range of 300 nm-2500 nm. A field emission SEM (FEI Quanta 450 FEG) was used to investigate the surface morphology of the films. XRD data were measured with Bruker D8 Discover X-ray diffractometer. A typical spectrum was scanned from 10° to 40° with a step size of 0.05° and a scan speed of 1.0° per second.

What is claimed is:

1. A Pb-free perovskite material having a general formula $A^{3+}B^+C^+_2X_6$ wherein:
   $A^{3+}$ is a trivalent metal cation,
   $B^+$ is a first monovalent metal cation,
   $C^+$ is a second monovalent metal cation,
   X is a monovalent nonmetal anion,
   the Pb-free perovskite material has been annealed to a surface of a substrate by an annealing process comprising an annealing time between about 10 and 30 minutes,
   the surface of the substrate comprises glass, and
   the Pb-free perovskite material has a wavelength of maximum absorbance from 1000 nm to 2800 nm.

2. The Pb-free perovskite material of claim 1, wherein $A^{3+}$ a bismuth trivalent cation, an antimony trivalent cation, or an indium trivalent cation.

3. The Pb-free perovskite material of claim 1, wherein $B^+$ is a silver monovalent cation, a copper monovalent cation, a gold monovalent cation, or a sodium monovalent cation.

4. The Pb-free perovskite material of claim 1, wherein $C^+$ is a cesium monovalent cation.

5. The Pb-free perovskite material of claim 1, wherein X is Br—, Cl— or I—.

6. The Pb-free perovskite material of claim 1, further comprising a stabilizer.

7. The Pb-free perovskite material of claim 6, wherein the stabilizer contains 1-(3-sulfopropyl) pyridinium hydroxide inner salt, dimethyl sulfoxide, or combinations thereof.

8. The Pb-free perovskite material of claim 6, wherein the stabilizer is glass.

9. The Pb-free perovskite material of claim 1, wherein the wavelength of maximum absorbance does not change at ambient temperature for longer than 8 days.

10. The Pb-free perovskite material of claim 1, wherein the annealing time is about 10 minutes.

11. The Pb-free perovskite material of claim 1, wherein the annealing process comprises an annealing temperature of between about 250 and 300° C.

12. A method of making the Pb-free perovskite material of claim 1, comprising:
   preparing a precursor solution in a solvent by:
      dissolving a first compound, comprising: $A^{3+}$, and X, in the solvent;
      dissolving a second compound, comprising: $B^+$, and X, in the solvent;
      dissolving a third compound, comprising: $C^+$, and X, in the solvent, wherein the molar ratio of the first compound:second compound:third compound is about 1:1:2, in the solvent;

dispersing the precursor solution on the substrate; and annealing the dispersed precursor solution on the substrate at an annealing temperature from 40-300° C., to form a Pb-free perovskite material.

13. The method of claim 12, wherein the annealing is done in a vacuum.

14. The method of claim 12, further comprising the substrate is heated to a temperature from 170-190° C. before dispersing the precursor solution on the substrate.

15. The method of claim 12, further comprising adding a stabilizer to the precursor solution before dispersing the precursor solution on a substrate.

16. The method of claim 15, wherein the stabilizer comprises 1-(3-sulfopropyl) pyridinium hydroxide inner salt, DMSO, or combinations thereof.

17. The method of claim 12, wherein the substrate is a glass substrate and the glass substrate is operative to stabilize the Pb-free perovskite material.

18. The method of claim 12, further comprising wherein the annealing temperature is selected from a temperature in the range from 40-300° C. and wherein the annealing temperature is operative to determine a wavelength of maximum SWIR absorbance of the Pb-free perovskite material.

19. The method of claim 12, wherein X is Br—, Cl—, or I—.

20. The method of claim 12, wherein the solvent is dimethylsulfoxide.

21. The method of claim 12, wherein the dispersing the precursor solution on a substrate is done by spin coating the precursor solution on the substrate.

22. The method of claim 12, wherein the first compound contains bismuth trivalent cation, antimony trivalent cation, indium trivalent cation, or combinations thereof.

23. The method of claim 12, wherein the second compound contains silver monovalent cation, copper monovalent cation, gold monovalent cation, sodium monovalent cation, or combinations thereof.

24. The method of claim 12, wherein the third compound contains cesium monovalent cation, an organic metal monovalent cation, an inorganic metal monovalent cation, or combinations thereof.

* * * * *